(12) United States Patent
Burke et al.

(10) Patent No.: US 7,183,216 B2
(45) Date of Patent: Feb. 27, 2007

(54) METHODS TO FORM OXIDE-FILLED TRENCHES

(75) Inventors: Cathie J. Burke, Rochester, NY (US); Peter M. Gulvin, Webster, NY (US)

(73) Assignee: Xerox Corporation, Stamford, CT (US)

( * ) Notice: Subject to any disclaimer, the term of this patent is extended or adjusted under 35 U.S.C. 154(b) by 25 days.

(21) Appl. No.: 11/132,000

(22) Filed: May 18, 2005

(65) Prior Publication Data

US 2006/0263990 A1 Nov. 23, 2006

(51) Int. Cl.
*H01L 21/311* (2006.01)
(52) U.S. Cl. .................. 438/700; 438/680; 438/770; 257/E21; 257/548; 257/559
(58) Field of Classification Search .................. 438/700, 438/637, 660, 661, 671, 679, 683, 770, 692
See application file for complete search history.

(56) References Cited

U.S. PATENT DOCUMENTS

| 5,814,547 A * | 9/1998 | Chang ........................ 438/329 |
| 6,716,661 B2 * | 4/2004 | Zou et al. ..................... 438/49 |
| 2003/0143817 A1* | 7/2003 | Ho et al. ..................... 438/435 |
| 2003/0143852 A1 | 7/2003 | En-Ho et al. |
| 2004/0121532 A1 | 6/2004 | Seo |
| 2005/0012158 A1 | 1/2005 | Gonzalez et al. |

* cited by examiner

*Primary Examiner*—David Nhu
(74) *Attorney, Agent, or Firm*—Fay, Sharpe, Fagan, Minnich & McKee, LLP

(57) ABSTRACT

A thermal oxidation process is used to fill trenches with an oxide; however, the oxidation process consumes some of the silicon. The embodiments herein advantageously apply this tendency for the oxidation process to consume silicon so as to convert all the silicon substrate material between the multiple trenches into an oxide. Therefore, because all of the silicon between the multiple trenches is consumed by the oxidation process, the multiple smaller trenches are combined into a single larger trench filled with the oxide.

19 Claims, 6 Drawing Sheets

FIG. 1 (PRIOR ART)
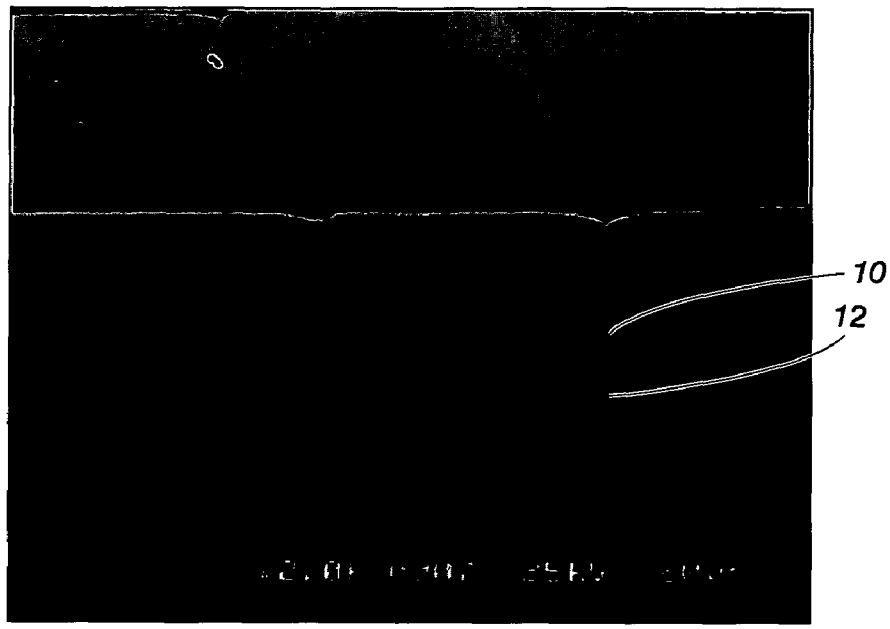
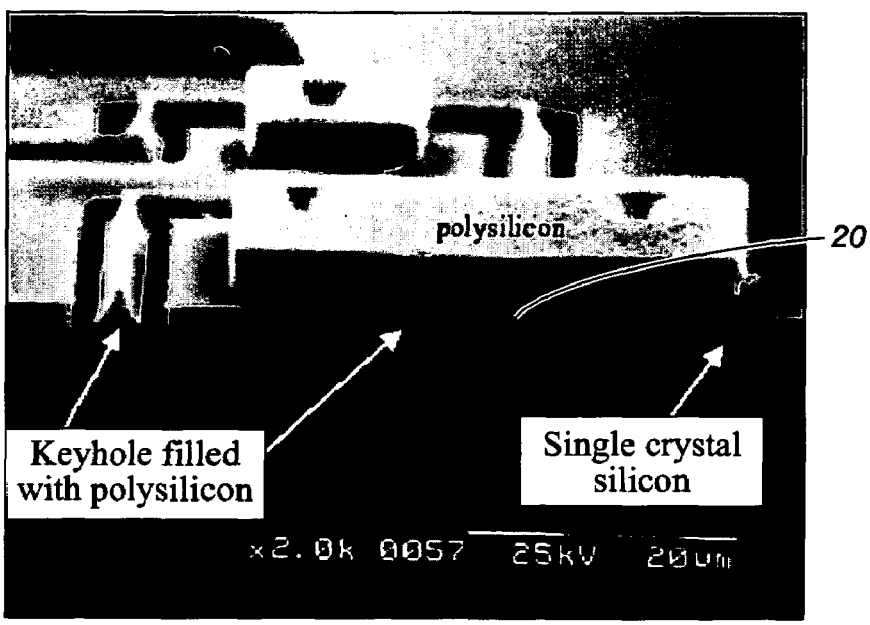
FIG. 2 (PRIOR ART)

US 7,183,216 B2

METHODS TO FORM OXIDE-FILLED TRENCHES

BACKGROUND

Embodiments herein generally relate to forming oxide-filled trenches in a process that advantageously applies the tendency for the well-known oxidation processes to consume silicon, so as to convert all the silicon substrate material between multiple trenches into an oxide. Therefore, because all of the silicon between the trenches is consumed by the oxidizing process, the multiple smaller trenches are combined into a single larger trench filled with the oxide.

One conventional disclosure U.S. patent application 2005/0012158, incorporated herein by reference, presents a process where trenches are filled by growing oxide within the trenches. Another (U.S. patent application 2004/0121532 incorporated herein by reference) discloses a method of forming a trench by selectively etching the oxide-inhibiting layer to form a LOCOS opening. Thermal oxidation is performed on a portion of the silicon wafer exposed through the LOCOS opening to form a LOCOS oxide layer. Other well-known processes for filling trenches with insulators or oxides include chemical vapor deposition (CVD), plasma CVD, spin-on oxide, etc. For example, U.S. patent application No. 2003/0143817, incorporated herein by reference, discloses filling multiple trenches with insulator or oxide material.

However, conventional processes for forming trenches filled with insulators often create a void or keyhole within the center of the insulator material. Further, such conventional processes may leave oxide on top of the wafer which must be removed. For example, as shown in FIGS. 1 and 2, voids 10 often remain within the oxide or insulator material 12. As shown in FIG. 2, these voids 10 can often be filled with conductors 20 such as polysilicon that are utilized in subsequent processing steps. The conventional solutions to compensate for (or avoid) forming such voids are complex, and time- and material-intensive.

For example, one solution to the problem of forming voids is disclosed in U.S. Patent Application No. 2003/0143852, incorporated herein by reference, which proposes a complex process of forming a high aspect ratio shallow trench isolation in a semiconductor substrate. This method includes the steps of forming a hard mask layer with a certain pattern on the semiconductor substrate, etching a portion of the semiconductor substrate not covered by the hard mask layer to form a high aspect ratio shallow trench in the semiconductor substrate; forming an oxide liner on the bottom and sidewall of the high aspect ratio shallow trench; performing a LPCVD to form a first oxide layer to fill the high aspect ratio shallow trench, a void being formed in the first oxide layer; etching a portion of the first oxide layer to a certain depth of the high aspect ratio shallow trench and to expose the void; and performing a HDPCVD to form a second oxide layer to fill the high aspect ratio shallow trench.

The above process demonstrates the complexity and time- and material-intensive nature of such conventional "solutions". Further, the conventional methodologies of forming oxide layers can produce a non-planar surface which requires subsequent chemical mechanical polishing (CMP) or other similar planarization processes. Therefore, there is a need for a process that easily and quickly creates oxide-filled trenches without forming voids therein and that does not require subsequent planarization processes.

SUMMARY

A method embodiment for forming oxide-filled trenches herein begins by forming an oxide-inhibiting layer or sacrificial layer (e.g., nitride) on a silicon substrate. Then, at least two openings are formed through the oxide-inhibiting layer and at least two trenches are formed in the silicon substrate below the openings in the oxide-inhibiting layer. The process of forming the openings and the process of forming the trenches can comprise a single, continuous process or can comprise multiple processes, depending upon the materials used.

Once the trenches are formed in the substrate, the trenches are heated in a oxygen atmosphere to oxidize the trenches. With the presence of the oxide-inhibiting layer over the substrate, oxide will only form within the trench. Then, the oxide-inhibiting layer can be removed to allow the subsequent processing to be performed on the substrate and oxide-filled trenches.

This oxidizing process fills the trenches with an oxide, but consumes some of the silicon. The embodiments herein advantageously apply this tendency for the oxidation process to consume silicon so as to convert all the silicon substrate material between the multiple trenches into an oxide. Therefore, because all of the silicon between the trenches is consumed by the oxidizing process, and because the resulting oxide occupies more space than the silicon it replaces, the multiple smaller trenches are combined into a single larger trench filled with the oxide.

With embodiments herein, a calculation can be performed to ensure that there is sufficient silicon substrate material between the trenches to ensure that the single larger trench is completely filled with oxide, yet at the same time ensure that there is not too much silicon substrate material between the trenches to prevent a single continuous larger trench from being formed. Therefore, the method embodiment can calculate the necessary volume of silicon substrate that is needed to be consumed to allow the oxidizing process to fill the single trench with the oxide. Thus, with this embodiment, the openings are spaced such that the necessary volume of silicon substrate will remain between the trenches when the trenches are formed in the silicon substrate. By maintaining the necessary volume of silicon substrate between the trenches, undesirable excess consumption of silicon substrate surrounding the single trench is reduced, limited, or prevented.

In addition, the embodiments herein can be utilized to form multiple larger oxide-filled trenches by performing the oxidation process on multiple sets of smaller, closely spaced trenches. More specifically, this embodiment also begins by forming a oxide-inhibiting layer on a silicon substrate. Then, at least two sets of openings are formed through the oxide-inhibiting layer, where each set of openings comprises at least two openings. Then, as a continuation of forming the openings in the oxide-inhibiting layer (or as a separate processing step) at least two sets of trenches can be formed in the silicon substrate below the sets of openings in the oxide-inhibiting layer. Thus, each set of trenches comprises at least two trenches. In other words, each set of trenches has two outer trenches, with one outer trench being at each end of each set of trenches.

Then, as before, the sets of trenches are oxidized. The oxidizing process fills each of the sets of trenches with an oxide so that all of the silicon between the outer trenches of each the set of trenches is consumed by the oxidizing process. Thus, each set of trenches is combined into a single trench filled with the oxide. This forms a different single trench for each the set of trenches that was patterned above.

As with the previous embodiment, before forming the sets of openings through the oxide-inhibiting layer, this embodiment can calculate the necessary volume of silicon substrate that is needed to be consumed to allow the oxidizing process to fill each the different single trench with the oxide. When forming of the openings within each of the sets of openings, this embodiment spaces the openings within each set of openings such that the necessary volume of silicon substrate will remain between the trenches within each set of trenches when the trenches are formed in the silicon substrate. Again, because of the presence of the necessary volume of silicon substrate between the trenches, undesirable excessive consumption of silicon substrate surrounding each the different single trench is limited.

These and other features are described in, or are apparent from, the following detailed description.

BRIEF DESCRIPTION OF THE DRAWINGS

Various exemplary embodiments of the systems and methods described in detail below, with reference to the attached drawing figures, in which:

FIGS. 1 and 2 are micrographs of a silicon substrate material;

DETAILED DESCRIPTION

As mentioned above, the conventional methodologies for forming oxide or insulator filled trenches often create non-planar surfaces and can sometimes leave voids within the trenches that can later be undesirably filled with conductors, such as polysilicon. The embodiments herein solve these problems and avoid the time-consuming process of thick oxide layer deposition and chemical mechanical polishing by utilizing an oxidation process to fill multiple closely spaced trenches with oxide. This process consumes the silicon substrate material between the closely spaced trenches, thereby forming a larger single trench that is filled with the insulator. This eliminates the complex time- and material-intensive processes that are conventionally used to avoid void formation. Further, the embodiments herein can simultaneously process large numbers (e.g., 200, etc.) of wafers through a single furnace process while conventional applications are required to process wafers individually. Therefore, the embodiments herein provide substantial processing efficiencies when compared to conventional methodologies.

Figure 3:
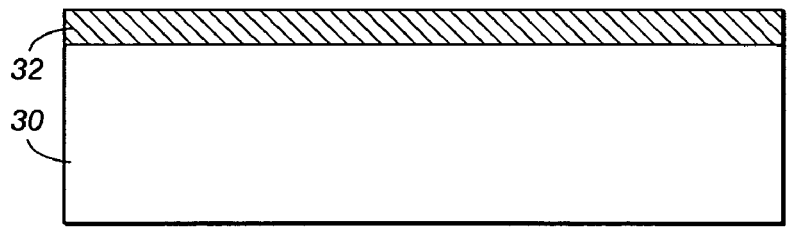
FIGS. 3–7 are cross-sectional schematic representations of sequential processing step results in which an insulator is formed within trenches of a substrate.
Figure 4:
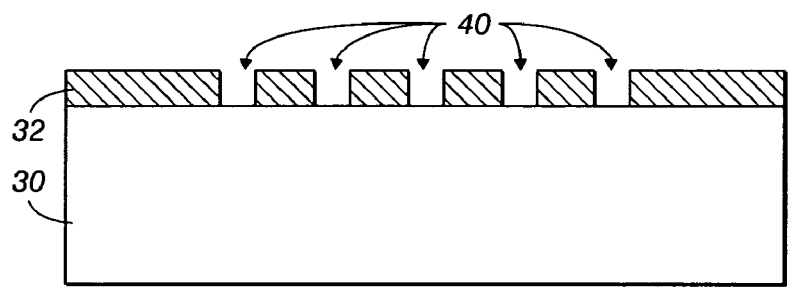
Figure 5:
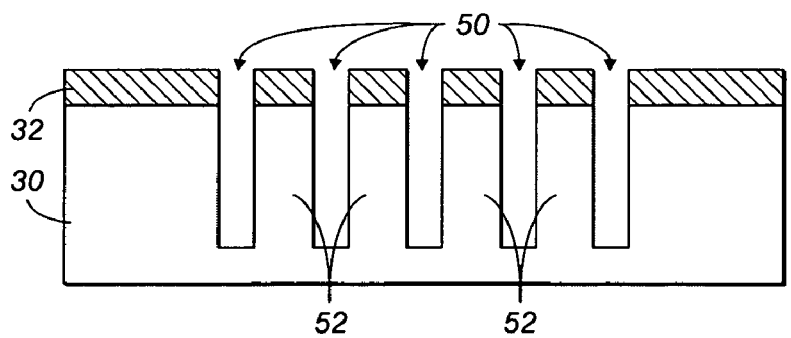
Figure 6:
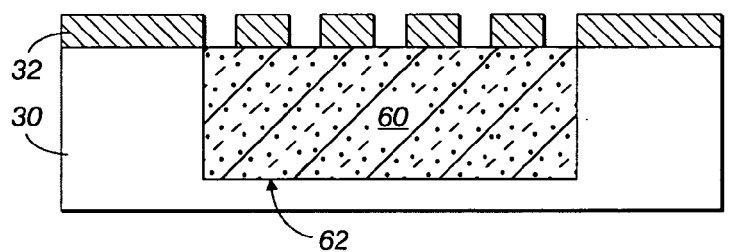
Figure 7:
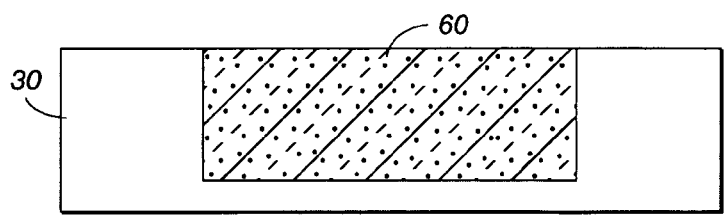

As shown in FIGS. 3–7, one method according to embodiments herein forms oxide-filled trenches 60, as shown in FIG. 7. More specifically, this process forms an oxide-inhibiting layer 32 (any material that will not readily oxidize, such as nitride, thick (1+micron) oxide, etc.) on a substrate 30, as shown in FIG. 3. The substrate 30 can comprise any surface capable of being readily oxidized, such as bulk silicon, single crystal silicon, polysilicon, amorphous silicon, etc. Then, as shown in FIG. 4, at least two openings 40 are formed through the oxide-inhibiting layer 32. The oxide-inhibiting layer 32 can be patterned using any conventional patterning technique, including photoresist mask patterning, laser patterning, cutting, grinding, tape transfer, etc. Additionally, at least two trenches 50 are formed in the silicon substrate 30 below the openings in the oxide-inhibiting layer 32, as shown in FIG. 5. The process of forming the openings 40 and the process of forming the trenches 50 can comprise a single, continuous process or can comprise multiple processes, depending upon the materials used. Therefore, the patterned sacrificial material 32 could act as a mask for the trenches 50 formed in the substrate 30.

Once the trenches 50 are formed in the substrate 30, the trenches 50 (and the remaining structure) are heated in an oxygen atmosphere to oxidize the trenches 50. As mentioned above, this process can simultaneously heat large numbers (e.g., 200 or more wafers, etc.) of structures through a single furnace process. The temperature and heating time for the oxide growth process will vary depending upon the oxygen concentration and material selected for the substrate 30, as is known in the art. With the presence of the oxide-inhibiting layer 32 over the substrate 30, oxide 60 will only form within the trench, and shown in FIG. 6. Then, as shown in FIG. 7, the oxide-inhibiting layer 32 can be removed by rinsing, polishing, etching, etc. to allow the subsequent processing to be performed on the substrate 30 and oxide 60 filled trenches 50, without needing to polish or planarize the upper surface of the substrate.

This thermal oxidizing process fills the trenches 50 with an oxide 60, but consumes some of the adjacent surrounding silicon 52. The embodiments herein advantageously apply this tendency for the oxidation process to consume silicon so as to convert all the substrate 52 material between the multiple trenches 50 into an oxide 60. Therefore, because all of the silicon between the trenches 50 is consumed by the oxidizing process, the multiple smaller trenches 50 are combined into a single larger trench 62 filled with the oxide 60.

With embodiments herein, a calculation can be performed to ensure that there is sufficient silicon substrate 52 material between the trenches 50 to cause the single larger trench 62 to be completely filled with oxide 60, yet at the same time ensure that there is not too much silicon substrate 30 material between the trenches 50, which would prevent a single continuous larger trench 62 from being formed. Therefore, the method embodiment can calculate the necessary volume of silicon substrate 30 that is needed to be consumed to allow the oxidizing process to completely fill the single trench 62 with the oxide 60, and have all the material 52 between the trenches consumed. This calculation can be based on modeling, empirical evidence, physical testing, etc. and will vary depending upon the material used for the substrate, the size of the trenches, the processing conditions selected during the oxidation process, etc. as is known in the art. Thus, with this embodiment, the openings are spaced such that the necessary volume of silicon substrate 52 will remain between the trenches 50 when the trenches 50 are formed in the silicon substrate 30. By maintaining the necessary volume of silicon substrate 52 between the trenches 50, undesirable excess consumption of silicon substrate 30 material surrounding the single trench 62 is reduced, limited, or prevented.

Figure 8:
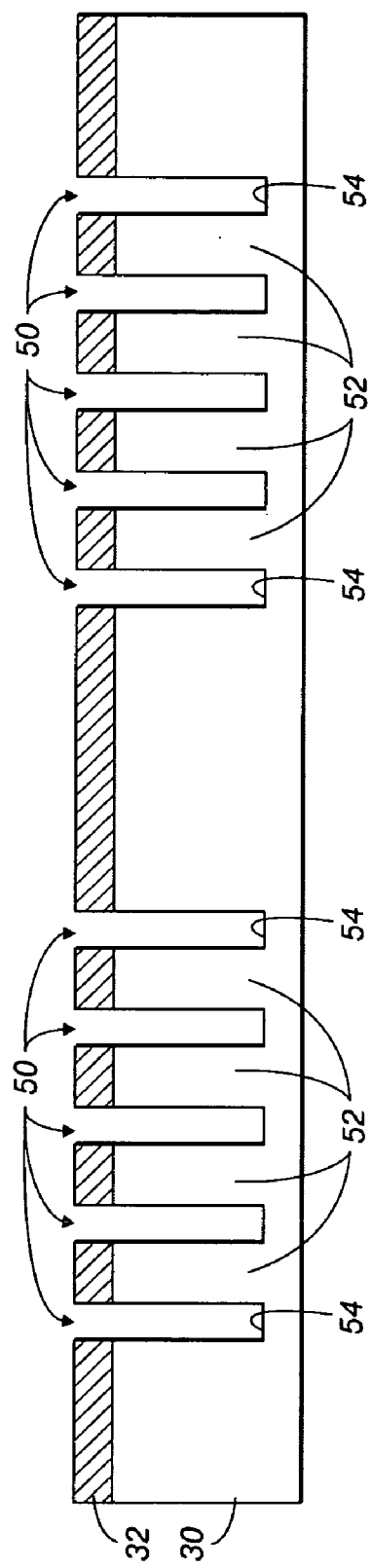
FIGS. 8 and 9 are cross-sectional schematic representations of the subject processing method to form multiple oxide-filled trenches.
Figure 9:
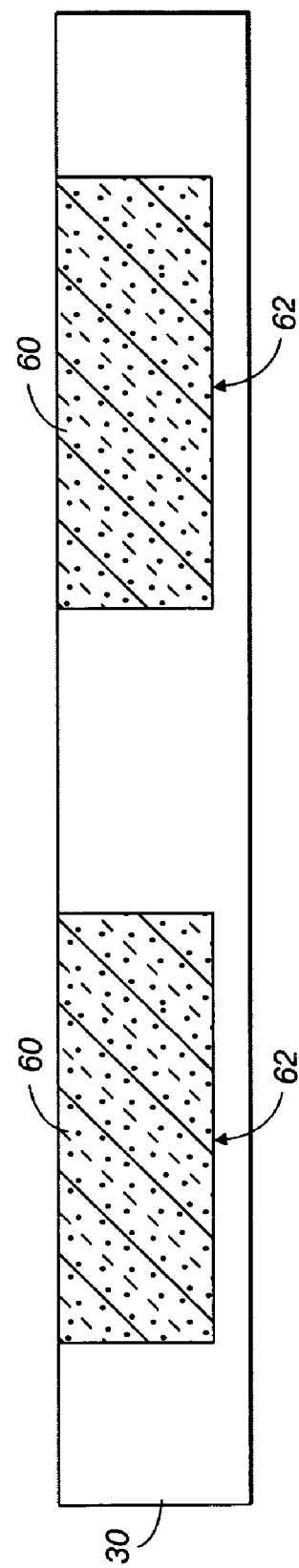

In addition, as shown in FIGS. 8 and 9, the embodiments herein can be utilized to form multiple larger oxide 60 filled trenches 62 (FIG. 9) by performing the oxidizing process (shown in FIGS. 3–7, which is explained in detail above) on multiple sets of smaller, closely spaced trenches 50, shown in FIG. 8. This embodiment also begins by forming an oxide-inhibiting layer 32 on a silicon substrate 30. Then, at least two sets of openings 50 are formed through the oxide-inhibiting layer 32, where each set of openings 50 comprises at least two openings. Then, as a continuation of forming the openings 50 in the oxide-inhibiting layer 32 (or as a separate processing step) at least two sets of trenches 50 can be formed in the silicon substrate 30 below the sets of openings 50 in the oxide-inhibiting layer 32 to achieve the structure shown in FIG. 8. Thus, each set of trenches 50 comprises at least two trenches. In other words, each set of trenches 50 has two outer trenches 54, with one outer trench 54 being at each end of each set of trenches 50.

As before, the sets of trenches 50 are oxidized. The oxidizing process fills each of the sets of trenches 50 with an oxide 60 so that all of the silicon between the outboard sides of the outer trenches 52 of each the set of trenches 50 is consumed by the oxidizing process. Thus, each set of trenches 50 is combined into a single trench filled with the oxide 60. This forms a different single trench 62 for each set of trenches 50 that was patterned above, as shown in FIG. 9.

As with the previous embodiment, before forming the sets of openings 40 through the oxide-inhibiting layer 32, this embodiment can calculate the necessary volume of silicon substrate 30 that is needed to be consumed to allow the oxidizing process to fill each different single trench 62 with the oxide 60. Further, while the trenches 50 and 62 are shown in FIGS. 8 and 9 as being the same size, different sized trenches 50 can be utilized within each set of trenches, and the final oxide 60 filled trenches 62 can also be different sizes with respect to one another. When forming of the openings 40 within each of the sets of openings, this embodiment also spaces the openings 40 within each set of openings such that the necessary volume of silicon substrate 30 will remain between the trenches 50 within each set of trenches 50 when the trenches 50 are formed in the substrate 30. Again, because of the presence of the necessary volume of silicon substrate 30 between the trenches 50, undesirable excessive consumption of silicon substrate 30 surrounding each different single trench 62 is controlled.

Figure 10:
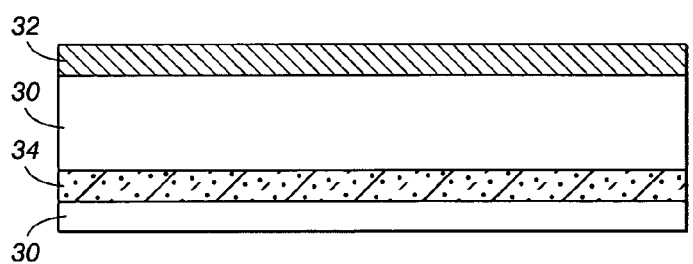
FIG. 10 is a cross-sectional schematic representation of another embodiment including an optional insulator layer.
Figure 11:
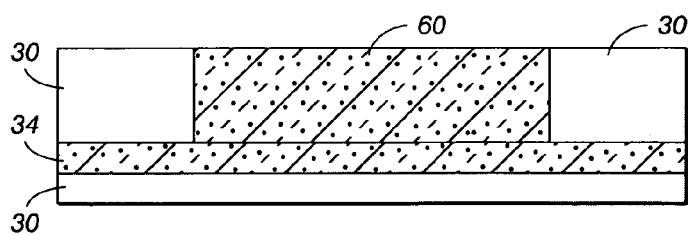
FIG. 11 is a cross-sectional schematic representation of the embodiment of FIG. 10 after the forming of the oxide-filled trenches.

FIGS. 10 and 11 illustrate another embodiment that is similar to the embodiments above, except that an optional insulator or oxide layer 34 is formed in the substrate before the oxide-inhibiting layer 32 is formed thereon. Then, the processing shown in FIGS. 3–7 (discussed above in detail) is performed to result in the structure shown in FIG. 11. In this embodiment, the trenches 50 can be formed to a depth to allow the oxide 60 to come in contact with the insulator/oxide layer 34.

Thus, with embodiments herein the thermal oxidation process is used to fill trenches 50 with an oxide 60; however, the oxidation process consumes some of the silicon. The embodiments herein advantageously apply this tendency for the oxidation process to consume silicon so as to convert all the silicon substrate 30 material between the multiple trenches 50 into an oxide 60. Therefore, because all of the silicon between the multiple trenches 50 is consumed by the oxidation process, the multiple smaller trenches 50 are combined into a single larger trench 62 filled with the oxide 60.

It will be appreciated that the above-disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

What is claimed is:

1. A method comprising:
 forming an oxide-inhibiting layer on a silicon substrate;
 forming at leas two openings through said oxide-inhibiting layer;
 forming at least two trenches in said silicon substrate below said openings in said oxide-inhibiting layer, wherein said trenches are spaced to dispose a selected volume of silicon substrate therebetween; and
 oxidizing said trenches,
 wherein said oxidizing process fills said trenches with an oxide, and
 wherein said selected volume of silicon substrate between said trenches is consumed by said oxidizing process such that said trenches are combined into a single trench filled with said oxide.

2. The method according to claim 1, further comprising, before said forming of said openings through said oxide-inhibiting layer, calculating a the selected volume of silicon substrate that is needed to be consumed to allow said oxidizing process to fill said single trench with said oxide.

3. The method according to claim 2, wherein said forming of said openings spaces said openings such that said selected volume of silicon substrate will remain between said trenches when said trenches are formed in said silicon substrate.

4. The method according to claim 2, wherein because of a presence of said selected volume of silicon substrate between said trenches, consumption of silicon substrate surrounding said single trench is reduced.

5. The method according to claim 2, further comprising, after said oxidizing of said trenches, removing said oxide-inhibiting layer.

6. The method in according to claim 1, wherein said oxide-inhibiting layer comprises a nitride.

7. The method according to claim 1, wherein said process of forming said openings and said process of forming said trenches comprises a single, continuous process.

8. A method comprising:
 forming an oxide-inhibiting layer on a silicon substrate;
 forming at least two sets of openings through said oxide-inhibiting layer, wherein each set of openings comprises at least two openings;
 forming at least two sets of trenches in said silicon substrate below said sets of openings in said oxide-inhibiting layer, wherein each set of trenches comprises at least two trenches such that each set of trenches has two outer trenches, with one outer trench at each end of each set of trenches; and
 oxidizing said sets of trenches,
 wherein said oxidizing process fills each of said sets of trenches with an oxide, and
 wherein all silicon substrate between said outer trenches of each said set of trenches is consumed by said oxidizing process such that each said set of trenches is combined into a single trench filled with said oxide, thereby forming a different single trench for each said set of trenches.

9. The method according to claim 8, further comprising, before said forming of said sets of openings through said oxide-inhibiting layer, calculating a volume of silicon substrate to be consumed to allow said oxidizing process to fill each said different single trench with said oxide.

10. The method according to claim 9, wherein said forming of said openings within each of said sets of openings spaces said openings within each set of openings such that said volume of silicon substrate will remain between said trenches within each set of trenches when said trenches are formed in said silicon substrate.

11. The method according to claim 9, wherein because of a presence of said volume of silicon substrate between said trenches, consumption of silicon substrate surrounding each said different single trench is reduced.

12. The method according to claim 9, further comprising, after said oxidizing of said sets of trenches, removing said oxide-inhibiting layer.

13. The method in according to claim 8, wherein said oxide-inhibiting layer comprises a nitride.

14. The method according to claim 8, wherein said process of forming said sets of openings and said process of forming said sets of trenches comprises a single, continuous process.

15. A method comprising:
 forming an oxide-inhibiting layer on a silicon substrate;
 forming at least two openings through said oxide-inhibiting layer;
 forming at least two trenches in said silicon substrate below said openings in said oxide-inhibiting layer; and
 oxidizing said trenches,
 wherein said oxidizing process fills said trenches with an oxide,
 wherein all silicon substrate between said trenches is consumed by said oxidizing process such that said trenches are combined into a single trench filled with said oxide,
 wherein said method further comprises, before said forming of said openings through said oxide-inhibiting layer, calculating a volume of silicon substrate to be consumed to allow said oxidizing process to fill said single trench with said oxide, and
 wherein said forming of said openings spaces said openings such that said volume of silicon substrate will remain between said trenches when said trenches are formed in said silicon substrate.

16. The method according to claim 15, wherein because of presence of said volume of silicon substrate between said trenches, consumption of silicon substrate surrounding said single trench is reduced.

17. The method according to claim 15, further comprising, after said oxidizing of said trenches, removing said oxide-inhibiting layer.

18. The method according to claim 15, wherein said oxide-inhibiting layer comprises a nitride.

19. The method according to claim 15, wherein said process of forming said openings and said process of forming said trenches comprises a single, continuous process.

* * * * *

UNITED STATES PATENT AND TRADEMARK OFFICE
CERTIFICATE OF CORRECTION

PATENT NO. : 7,183,216 B2  
APPLICATION NO. : 11/132000  
DATED : February 27, 2007  
INVENTOR(S) : Cathie J. Burke et al.

Page 1 of 1

It is certified that error appears in the above-identified patent and that said Letters Patent is hereby corrected as shown below:

In the Specification

Insert at Column 1, line 4, the following paragraph heading and paragraph:

-- STATEMENT REGARDING FEDERALLY SPONSORED RESEARCH OR DEVELOPMENT

This invention was made with Government Support under Contract No. 70NANB7H3007 awarded by the National Institute of Standards and Technology (NIST). The Government has certain rights in this invention. --

Signed and Sealed this  
Seventeenth Day of June, 2014

Michelle K. Lee  
*Deputy Director of the United States Patent and Trademark Office*